United States Patent [19]
Sohda et al.

[11] Patent Number: 5,650,631
[45] Date of Patent: Jul. 22, 1997

[54] ELECTRON BEAM WRITING SYSTEM

[75] Inventors: Yasunari Sohda, Hachioji; Masahide Okumura, Sagamihara; Yasuhiro Someda, Kokubunji; Hidetoshi Satoh, Hachioji; Yoshinori Nakayama, Sayama; Norio Saitou, Tokorozawa, all of Japan

[73] Assignee: Hitachi, Ltd., Tokyo, Japan

[21] Appl. No.: 470,592

[22] Filed: Jun. 7, 1995

[30] Foreign Application Priority Data

Jun. 24, 1994 [JP] Japan .................... 6-142860

[51] Int. Cl.⁶ .................................... H01J 37/30
[52] U.S. Cl. .................................... 250/492.2; 250/398
[58] Field of Search ................... 250/396 R, 398, 250/492.2, 492.22

[56] References Cited

U.S. PATENT DOCUMENTS

| | | | |
|---|---|---|---|
| 4,153,843 | 5/1979 | Pease | 250/492.2 |
| 4,980,567 | 12/1990 | Yasuda et al. | 250/398 |
| 5,144,142 | 9/1992 | Shunsuke et al. | 250/398 |
| 5,262,341 | 11/1993 | Shunsuke et al. | 437/51 |
| 5,288,567 | 2/1994 | Sakamoto et al. | 250/492.2 |
| 5,376,802 | 12/1994 | Sakamoto et al. | 250/398 |

OTHER PUBLICATIONS

Journal of Vacuum Science and Technology B, vol. 6, No. 6, 1988, "Microstructures for particle beam control", Jones et al, pp. 2023–2027.

*Primary Examiner*—Bruce Anderson
*Attorney, Agent, or Firm*—Fay, Sharpe, Beall, Fagan, Minnich & McKee

[57] ABSTRACT

A blanking array is used for controlling an electron beam in an electron beam writing system. Electrodes in the array are formed in parallel and two sets of the parallel electrodes, orthogonal to one another, are used for dividing the electron beam into a plurality of individual exposure areas. The sets of parallel electrodes can be formed in one array by a wire mesh or in two separate arrays spaced closely together or farther apart at different focal point positions. The electrodes are provided to extend across an aperture, such as a square or triangular aperture. For a triangular aperture, the electrodes are made parallel to the hypotenuse of the triangle. The writing patterns are formed by combining the exposure areas. Control of each exposure area is realized by applying opposite polarity voltage to adjacent electrodes in order to deflect the portion of the beam passing between the adjacent electrodes. The deflected beam portions are blocked by a downstream aperture that permits the non-deflected electron beam portions to pass through for forming the patterns to be written.

30 Claims, 22 Drawing Sheets

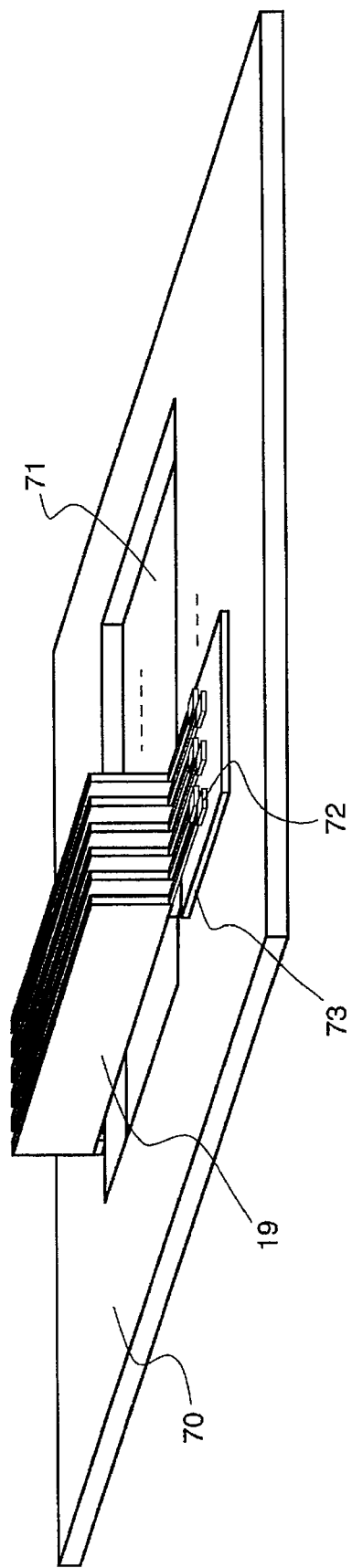

ELECTRON BEAM WRITING SYSTEM

FIELD OF THE INVENTION

The present invention relates to an electron beam writing system and, in particular, to a high-speed electron beam writing system.

BACKGROUND OF THE INVENTION

A method of controlling a plurality of electron beams in an electron beam writing system is disclosed in Jones, et al., Journal of Vacuum Science and Technology B, Vol. 6, No. 6, 1988.

According to Jones, et al., blanking electrodes are provided for a plurality of apertures, as shown in FIG. 2 of the article, which are irradiated with a broad collimated electron beam that passes through the apertures. As a result, a plurality of individually controlled electron beams are formed. Voltages are applied to the blanking electrodes for each aperture, and depending upon the figure or pattern that is to be written on the stage, the electron beams are either deflected when exiting the apertures before reaching the stage or pass through undeflected for direct-write patterning. Thus, graphic patterns of any shape can be formed. That is, the electron beams are blanked independently of each other as point beams, and are controlled for each of the picture elements of the pattern to be written.

SUMMARY OF THE INVENTION

According to the above-mentioned prior art in which the individual electron beams are formed using an array of apertures and then independently controlled, when the number of individual beams to be controlled is increased in an attempt to increase the throughput, there arises a problem in that the control system for controlling the blanking of the individual apertures becomes correspondingly complex and difficult to implement.

An object of the present invention is to provide a method and an apparatus for controlling the writing of a spread or broad electron beam without using apertures for dividing the beam into separately deflected individual beams.

This object is achieved by providing one or more blanking arrays of linear blanking elements for deflecting the electron beam. Preferably, the linear blanking elements are electrodes that are formed in parallel and arranged in an electron beam writing system on the objective plane. As a result, a simple control operation is carried out by simultaneously controlling a plurality of the blanking elements arranged along lines extending across the electron beam path.

DETAILED DESCRIPTION OF THE PREFERRED EMBODIMENTS

As shown in FIGS. 1(a)–1(e) and FIG. 3, there are provided blanking arrays according to the invention having a plurality of electrodes for linearly deflecting an electron beam depending upon a voltage applied to two neighboring electrodes. When the blanking arrays are used in an electron beam writing system, the non-deflected portions of the electron beam pass through an aperture 47 provided at a lower part of the electron beam column while the deflected portions thereof are blocked by the aperture so they do not arrive at the surface of the wafer 15, which is supported on a stage 60.

Figure 3:
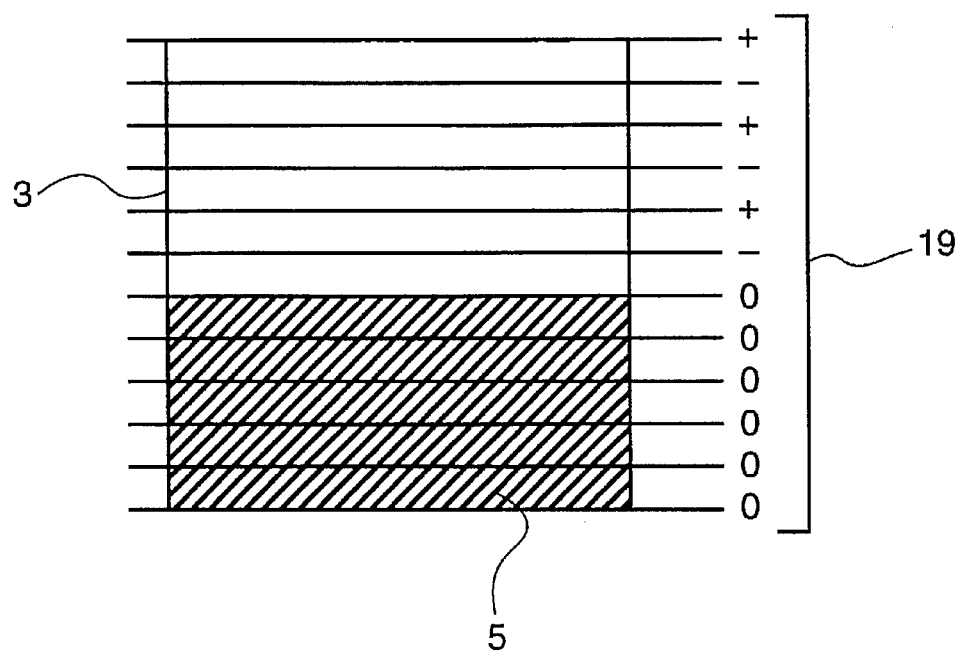
FIG. 3 is a diagram illustrating the principle of operation of the blanking array of the present invention.

Specifically, voltages are applied to the electrodes, which may be electric wires, and the electron beam is deflected by a potential difference between the neighboring electric wires. In FIG. 3, (0) represents ground or zero voltage, and (+) and (−) represent that a positive voltage and a negative voltage are applied with respect thereto. When there is a potential difference between the neighboring electrodes, a linear portion of the electron beam is deflected with respect to the beam path of the remainder of the electron beam and is interrupted by the aperture 47 in a subsequent stage. The non-deflected portion of the electron beam arrives at the surface of the wafer 15. Furthermore, preferably, two arrays are provided as shown in FIG. 1. A first array image 11 is formed on the second array 10, whereby only those that portion of the electron beam that is not blanked by the two arrays contributes to the exposure.

Figure 1A:
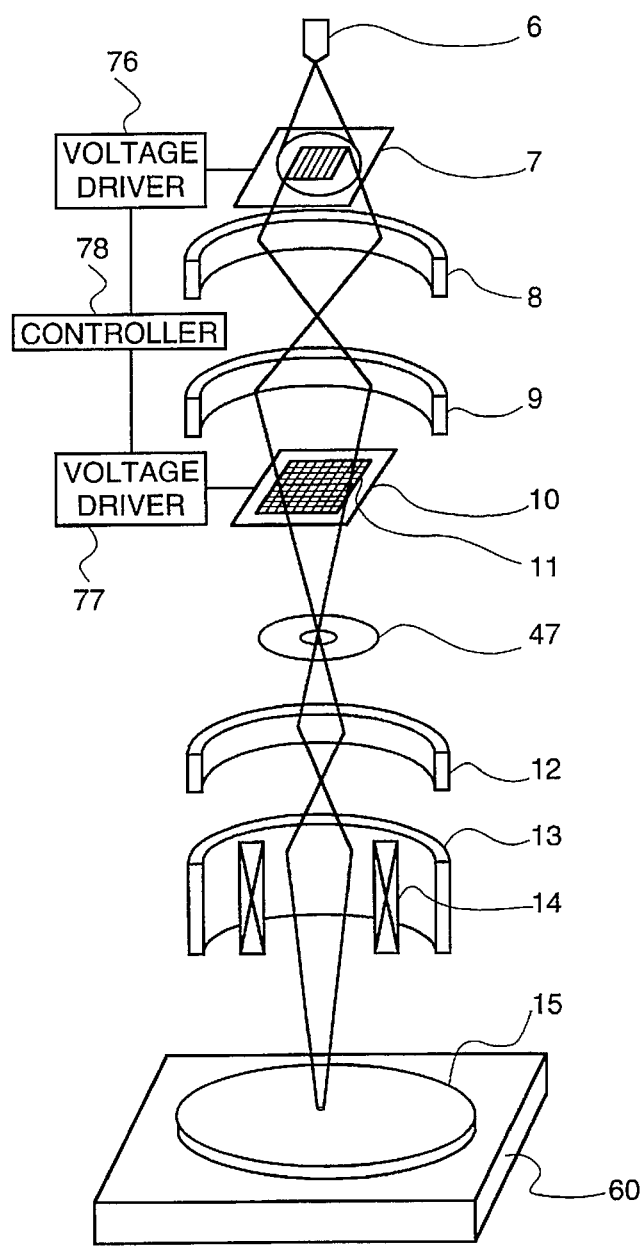
FIGS. 1(a) is a diagram of an electro-optical system with blanking arrays of the present invention, and FIGS. 1(b)–1 (e) are diagrams showing details of the blanking arrays.
Figure 1B:
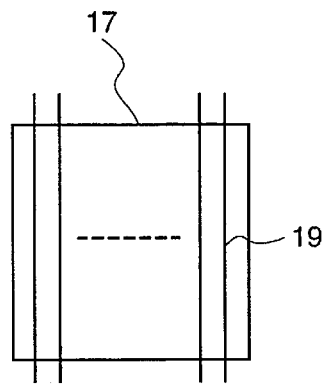
Figure 1C:
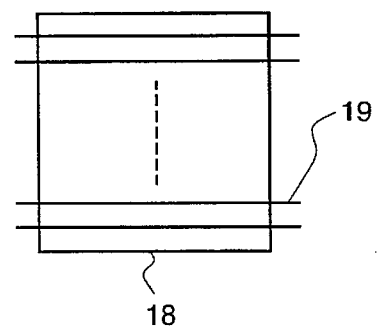
Figure 1D:
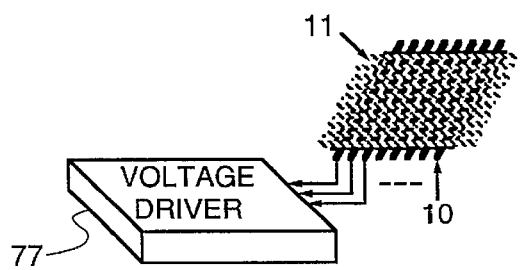
Figure 2:
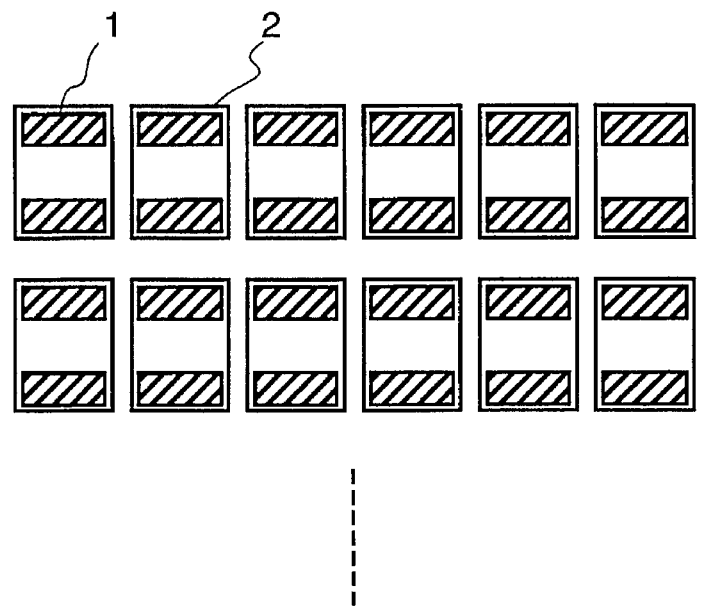
FIG. 2 is a diagram illustrating the structure of a conventional blanking array.

In order to form a complex pattern with a preferred embodiment of the apparatus of the present invention, a plurality of blanking arrays, namely two, are used as shown in FIG. 1(a). As shown in FIG. 1(d), the image 11 of the upper blanking array 7 is superimposed on the lower blanking array 10. As a result, the part of the electron beam in an area that is not blanked by either of the arrays is written on stage 60 on which wafer 15 is provided. A conventional blanking array having apertures makes individual beams which are controlled independently by blanking. On the other hand, according to the invention, the beam is shaped by controlling the blanking of each row and column of the cross sectional area of the beam.

The direction of the image 11 of the first or upper blanking array 7 is not only perpendicular or orthoganal to the lower blanking array 10, but also may be angled with respect to the same at an angle of 45 degrees as desired. By providing the arrays of the blanking elements extending orthogonal to one another, the electron beam can be formed into picture element patterns or electron beam areas 3 that are projected onto the surface of the wafer. By selectively controlling the deflection of the electron beam using the conductors or electrodes of the arrays, only the selected electron beam of areas 5 that are not deflected reach the wafer 15.

In the first embodiment of the invention, the blanking shaped picture elements are arranged in square form. The square form of the picture elements results from the use of a plurality of parallel electrodes or wires that extend across the electron beam path in each of the arrays as shown in FIGS. 1(b) and 1(c). In particular, wires 19 in array 17 shown in FIG. 1(b) extend in one direction while the wires 19 in array 18 shown in FIG. 1(c) extend in a direction crossing at right angles to the wires of the array 17. The areas bound by the periphery of the intersections of the superposed arrays form the picture elements that are written.

A practical embodiment of realizing the construction of an array according to the invention having electrodes extending parallel to one another and extending in one direction is shown in FIG. 1(e). In the figure, electrodes 19 of a rectangular shaped wire are shown extending across a square aperture 71 formed in a substrate 70. The conductors are bonded to leads that terminate in bonding pads 72 formed on an insulator layer 73. The bonding pads are connected to a voltage driver, such as voltage drivers 76 and 77 shown in FIG. 1(a).

The voltage potential applied to the electrodes of the blanking array(s) is controlled by a controller 78, such as computer, as shown in FIG. 1(a). The connection of a control system to the remainder of the components of the electron beam writing apparatus is not shown. It is understood that the electron source 1, first and second projection lenses 8 and 9, respectively, demagnifying lens 12, objective lens 13 and objective deflector 14, as well as stage 60, are respectively connected to a control system that is operated in a conventional manner as readily understood by those having ordinary skill in the art.

Figure 4:
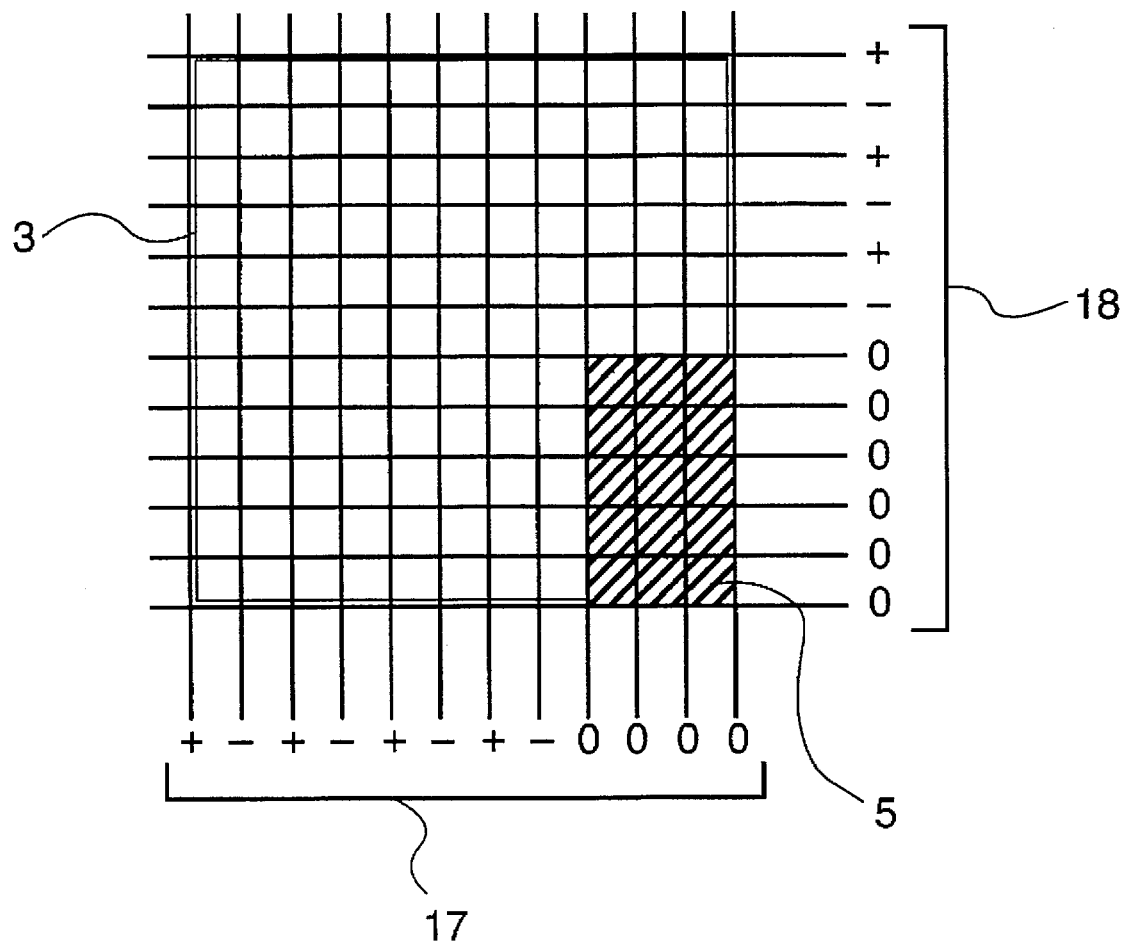
FIG. 4 is a diagram schematically illustrating a two-dimensional blanking array.

FIG. 4 shows an embodiment of the blanking array of the invention wherein the same effects as those of using the above-mentioned two blanking arrays in combination can be expected if the electrodes are provided to extend in two directions to respectively form "X" and "Y" electrodes 17 and 18 which are orthogonal to one another, in one array. Though the structure of the blanking array becomes complex, any rectangular shaped beam pattern can be formed by using such a single blanking array. The figure shows the potential applied to the electrodes in order to project the picture elements 5 and deflect the areas 3 in which the electron beam is not projected on the wafer being written. Furthermore, the number of directions in which the electrodes extend is in no way limited to two, but three or more directions may be used in combination. Alternatively, the electrodes may be arranged in several planes close to each other provided that they are within the depth of focus.

By further using the square aperture, for example as shown at 71 in FIG. 1(e), of the blanking array of the invention as a conventional aperture in a variable shaped electron beam writing method, both the variable shaped method and the blanking array control method of the present invention can be provided and utilized in a single apparatus. In particular, a conventional aperture can be used in a conventional variable shaping method wherein a rough size is determined by moving the aperture at an upper position and a fine size can be defined by using one or more blanking arrays of the embodiments of the invention arranged downstream thereof.

Figure 5:
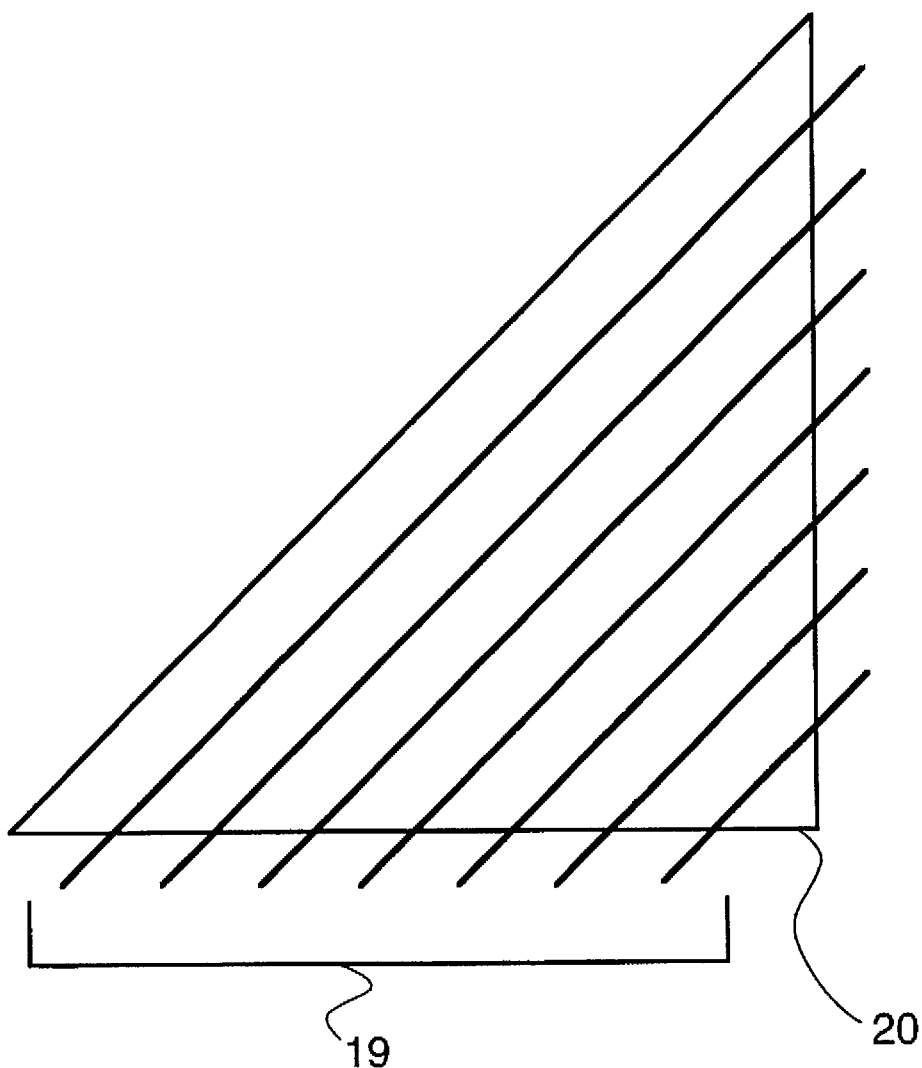
FIG. 5 is a diagram schematically illustrating a blanking array having a plurality of angled wires as the electrodes of the array.

As shown in FIG. 5, furthermore, a plurality of electrodes 19 can be provided at an angle in a triangular aperture 20 that has two sides intersecting at right angles. Voltage is applied to the two neighboring electrodes in order to linearly deflect the electron beam and to write angled blanking shaped patterns.

The blanking array(s) may be made up of electrodes, such as square wires, only, but may have a linear substrate or a mesh finer than the resolution of the electro-optical system in order to increase the mechanical strength of the array(s). With such a construction, the substrate may be either an electron absorber or an electron scatterer.

Figure 6:
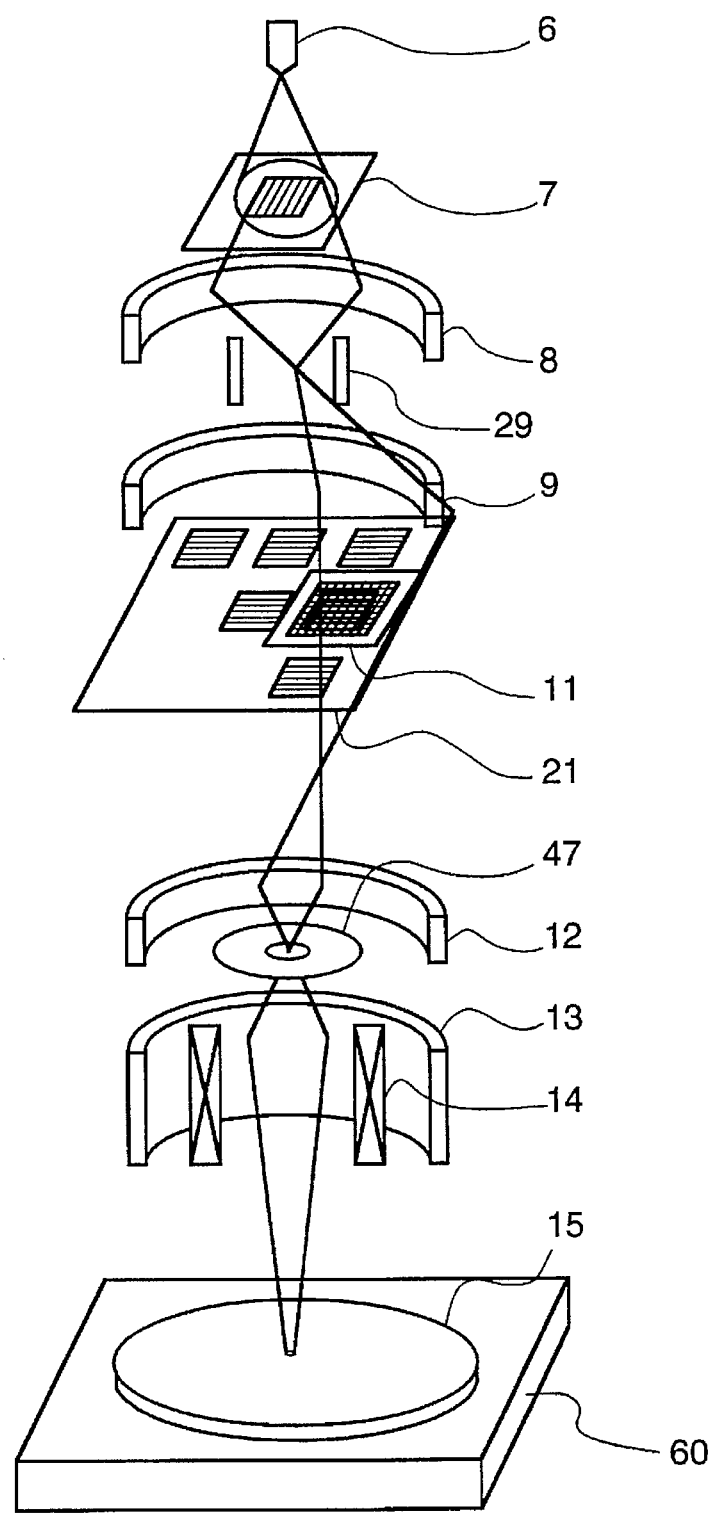
FIG. 6 is a diagram of an electro-optical system capable of selecting a plurality of blanking arrays.

The blanking arrays of the present invention may be arranged in plural number in the apparatus. By deflecting the electron beam by using an array selector/deflector 29 as shown in FIG. 6, in particular, any one of a plurality of blanking arrays, such as arrays 11 and 21 can be selected at high speed. Preferably, such a plurality of blanking arrays should be provided with electric power that is supplied from opposing directions whereby four or more neighboring arrays can be controlled independently of each other. However, the voltage drivers and control components for the apparatus shown in FIG. 6 are not shown for purposes of clarity since it is understood from the discussion of FIG. 1(a) that these components are included in the system.

According to the system of the present invention, any desired pattern can be effectively written by executing the exposure in a plurality of steps, even though not every type of pattern can be formed in one exposure.

Further, according to the invention, in order to remove side effects of the deflection voltage and to increase the life of the electrodes, which are bombarded by the electron beam, the arrays may be provided with ground lines in a shape similar to that of the arrangement of the electrodes.

Figure 7A:
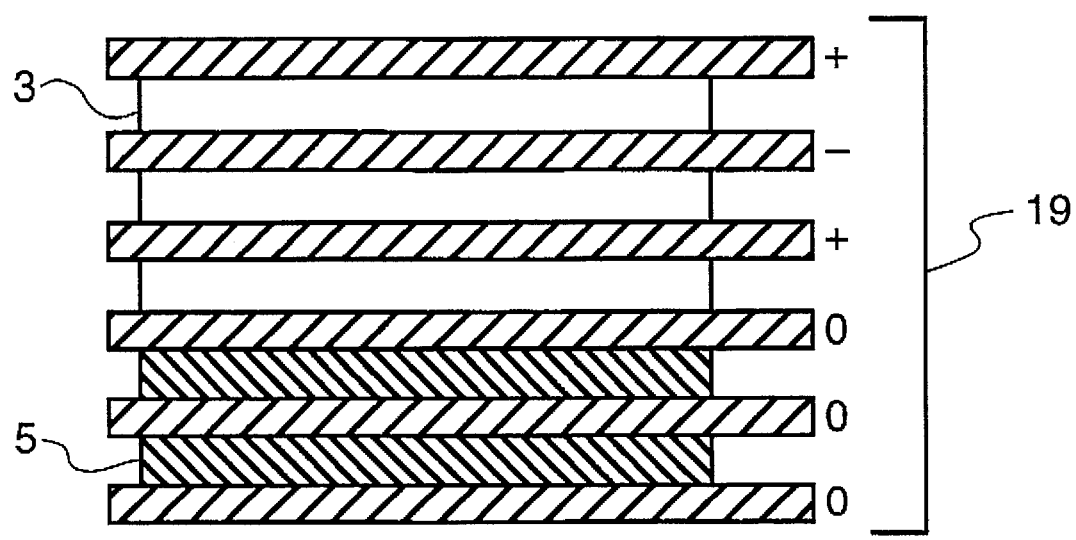
FIGS. 7(a) and 7(b) are diagrams illustrating the structure of a blanking array having electrode wires of a broad width.
Figure 7B:
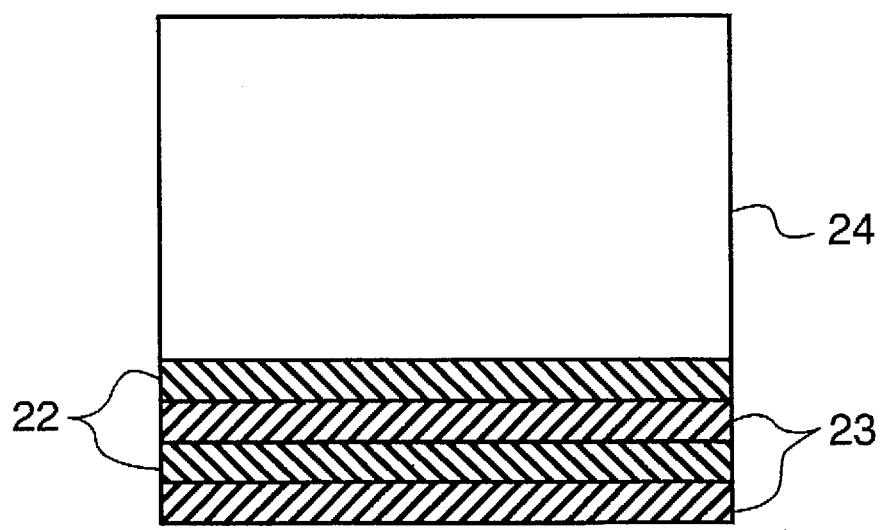

The blanking array of the invention preferably has very slender or narrow electrodes. However, to increase the mechanical strength of the electrodes, the width of the electrodes may be increased. If the spacing between the electrodes as imaged on the sample surface becomes larger than the resolution of the electro-optical system, however, the image of the electrodes is formed on the sample. In this case as shown in FIGS. 7(a) and 7(b), wherein electrodes 19 are spaced sufficiently far apart to cause the image of the electrodes to be projected, the areas in image area 24 remaining unexposed are exposed to electrons by shifting the image of the blanking array. In FIG. 7(b), the image at the time of the second exposure is shifted by a distance equal to a width of an electrode of the array so that at first, areas 23 are exposed and then areas 22 are exposed after the shifting. To adapt this method, the spacing between the electrodes (transparent portion) and the width of the electrodes (shade portion) of the blanking array must have substantially the same width, and the difference therebetween should be less than 20%.

According to another aspect of the invention, the blanking array control method of the present invention can be used with a cell projection method for effectively controlling the writing of the picture elements.

The blanking array is preferably made of a high electric and thermal conductive material. Therefore, it is convenient to plate the electrodes with gold or copper. Besides, a base plate for supporting the blanking array plays an important role and must have good electric conductivity and thermal conductivity. If machinability is also taken into consideration, it is desired to use a compound of a low mass number element such as silicon or silicon carbide, or an insulating compound of a low mass number element coated with a conductive layer.

A specific embodiment of the blanking array is described with reference to FIGS. 1(a)–1(c) and 3. As shown in FIG. 3, the electron beam exposure area is divided by 12 electrodes. This makes it possible to control 11×11=121 electron beam exposure areas or points. That is, the writing of the 121 picture elements is controlled by controlling the linear blanking elements each consisting of 12 elements (electrodes). If each of the electron beam exposure areas were to be individually controlled by a conventional blanking array having apertures for each of the exposure areas, 121 different controls would be necessary. According to the present invention, on the other hand, the voltage potential applied to only 24 electric wires is controlled. Although a limitation is imposed on the pattern that can be written at one time as compared with the aperture blanking array system which controls a plurality of individual beams using the blanking array of apertures, the control operation and the fabrication of the linear blanking array of the present invention is strikingly simplified. This difference becomes quite significant when the electron beam exposure area is increased in order to increase the throughput. Further, although any square writing area or pattern can be written if the picture elements are arranged in a square shape, even more complex control of the writing patterns can be accomplished if use is made of three or more blanking arrays or one blanking array having electrodes extending in three different directions. Moreover, the blanking arrays can be provided close to each other within a depth of the focal point, and many blanking arrays can be used without using many lenses.

Figure 8:
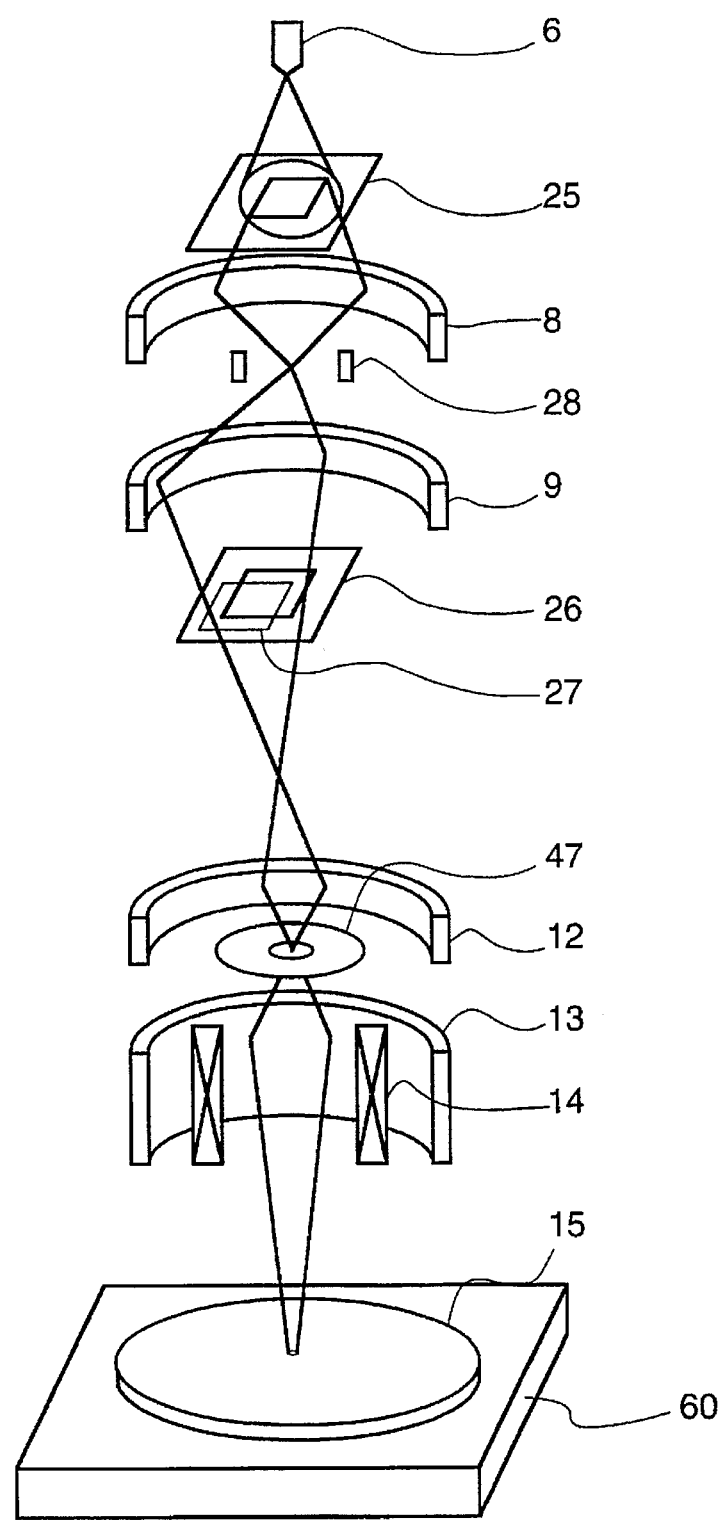
FIG. 8 is a diagram of an electro-optical system of a variable shaped electron beam writing system.

FIG. 8 illustrates the construction of a conventional variable shaped electron beam writing system. In the conventional art, it is necessary to adjust a shaping deflector 28 to superpose a first aperture image 27 on a second aperture 26. This, however, causes a deterioration in the shot stitching or the dimension accuracy at the time of writing a fine pattern. According to the present invention, however, the shape of the electron beam is determined by the picture elements that are to be blanked, and the error factor is small and improved accuracy is accomplished. According to the system of FIG. 1 in which the control is accomplished in two directions, square shaped beams of various sizes can be formed. Moreover, triangular beams of various sizes can be formed if the direction of the blanking array image is slanted at an angle of, for example, 45 degrees with respect to the blanking array that is illuminated.

By using square aperture of the blanking array of the invention also as an aperture for a conventional variable shaped electron beam exposure method, furthermore, an ordinary variable shaped method can be accomplished by the combination of the rectangular opening and the variable shaping deflector in a state where the blanking is all turned off. This enables the simple changing over between both methods.

Provision of a substrate of a shape resembling the blanking array and a mesh finer than the resolution of the electron optics is effective in increasing the mechanical strength of the blanking array. Even when an electron scatterer is used as the substrate, there can be expected a masking effect by interrupting the scattered electrons by the blanking aperture.

By selecting a plurality of blanking arrays using a deflector, the blanking can be accomplished in a variety of directions to write various patterns. For instance, an arrangement can be provided of blanking arrays with electrodes extending in various directions or an arrangement of blanking arrays having electrodes extending different pitches. The deflector may be either an electrostatic type one or an electromagnetic type. For high-speed writing, however, an electrostatic deflector having a high response speed is preferred.

Figure 9:
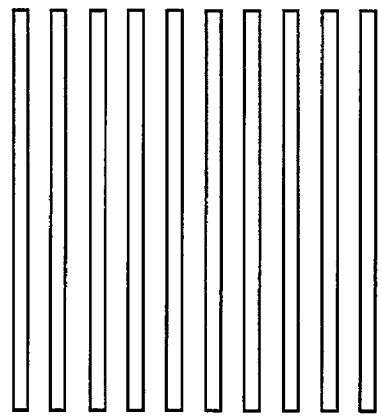
FIGS. 9(a)–9(c) are diagrams useful for explaining the steps of forming a complex pattern according to the invention.
Figure 9:
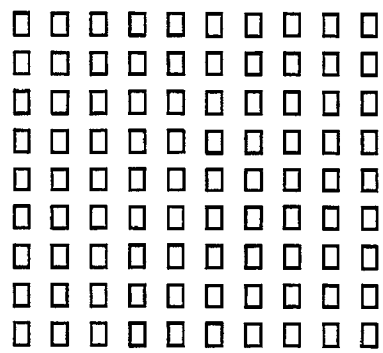
Figure 9:
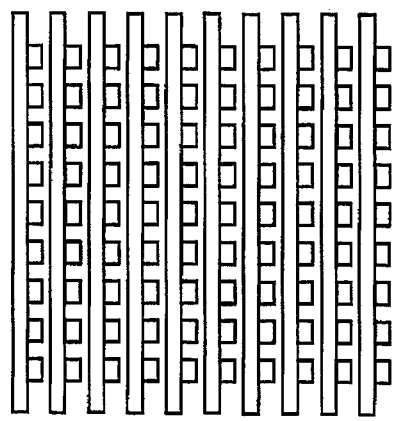

The system of the invention can write even a complex figure using a relatively small number of shot lines. For instance, figures can be written as shown in FIGS. 9(a)–9(c) wherein the pattern of FIG. 9(a) is written first and the pattern of FIG. 9(b) is written the second time to write a complex pattern shown in FIG. 9(c) through two times of exposure. To write this pattern using a variable shaping electron beam method, 100 shots are necessary. Accordingly, the present invention provides a reduction in the number of shots to 1/50 of that required to form the same pattern by a variable shaping method.

Moreover, forming the ground wires of a shape resembling these arrays is effective in preventing the trajectory of the electron beam from changing outside the area where the blanking is effected with the deflecting voltage.

In the case that a blanking array is required to have wide electrodes, two blanking arrays at a half-pitch interval can be used in a complementary manner by setting the width of the electrodes to be substantially equal to the gap of the opening therebetween. The number of shots increases in this case as compared with that of the narrow electrode width blanking array, but the array can be easily fabricated. Furthermore, when the width of the electrodes is set to be substantially equal to the gap of the opening, the difference therebetween should be less than 20%.

A conventional aperture type blanking array that requires the control operation for each of the individual beams passing through the apertures may be combined with the blanking array of the present invention, so that small and complex figures can be written by the conventional blanking array using individual aperture control while figures of long wirings and the like are accomplished by the blanking array of the invention. The blanking array that effects the control operation for each of the picture elements is not adapted to large areas. This enables the advantages of the blanking array of the present invention to be realized, even when used in combination with a conventional aperture type blanking array. When the cell projection method is used in combination, on the other hand, the blanking array of the present invention, in principle, makes it possible to write, through one time of exposure, a figure that cannot be written in one time of exposure by the cell projection method, contributing to increasing the writing speed.

Figure 10:
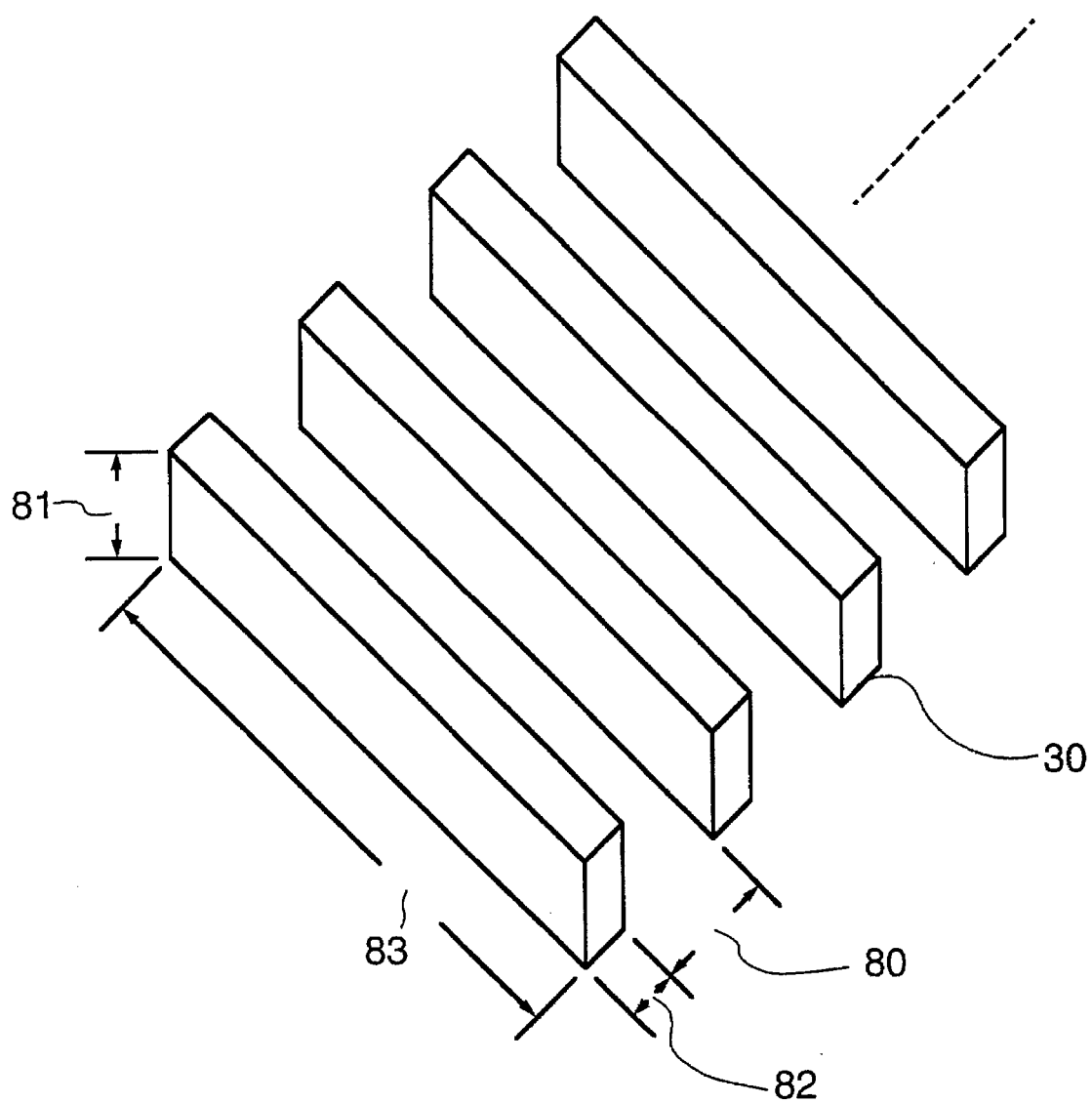
FIG. 10 is a diagram illustrating the electrode structure of a blanking array according to a first embodiment of the invention.

FIG. 10 illustrates the structure of a portion of a blanking array according to a first embodiment of the invention. According to this embodiment, electrodes 30 are arranged so as to constitute 101 square wire lines. According to this embodiment the spacing 80 between the electric wires is 1.6 μm, the height 81 of the wires is 4 μm, the width 82 is 0.4 μm and the length 83 thereof is 200 μm. A voltage of 10 V is applied to these electric wires to deflect the electrons.

Figure 11:
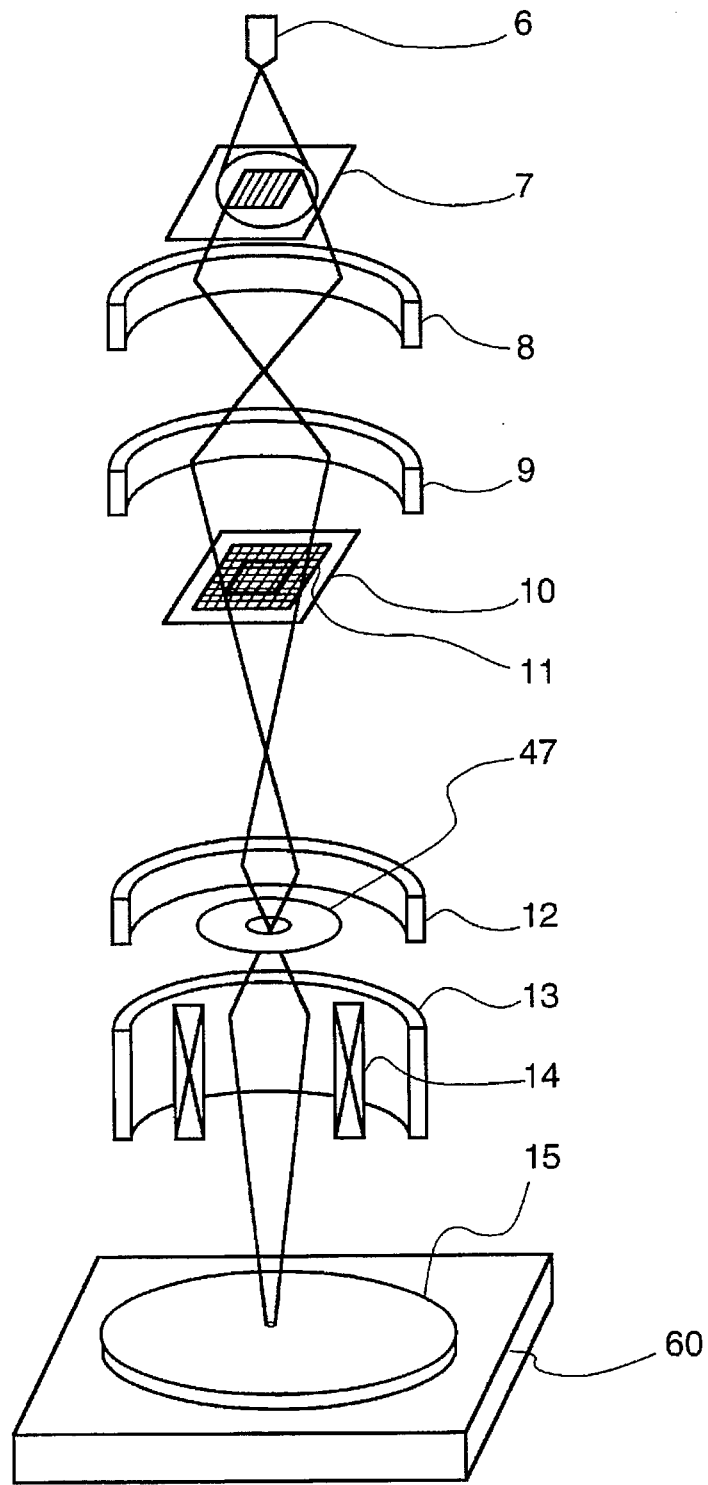
FIG. 11 is a diagram of an electro-optical system according to the first embodiment of the invention of the embodiment 1.

FIG. 11 illustrates an electro-optical system which is nearly the same as the electro-optical system used in a conventional variable shaped method electron beam writing. The blanking arrays are arranged at upper and lower positions, respectively, and the electrodes, as a result of the image of the upper blanking array 7 meets the direction of the lower blanking array electrodes 10 orthogonally or otherwise at right angles. The electron beam passing through the blanking arrays is reduced in size to 1/40 through a demagnifying lens 12 and is finally focused on a wafer 15. The width 82 of the electric wires which is 0.4 μm becomes less than 0.01 μm as projected on the wafer. If the resolution of the electro-optical system is set to be about 0.1 μm, the electric wire image is not resolved, and figures having quarter-micron can be written.

The distance between the electrodes of the blanking arrays 1, 2 is preferably 0.05 μm, and the figure that is written is controlled relying upon this unit. The electrons deflected by the blanking array are interrupted by an objective aperture 47 and do not reach the stage on which a wafer, for example, is positioned. Accordingly, only those electrons that are not deflected by any of the blanking arrays arrive at the stage. Therefore, a square of 5 μm is written with a square picture element of 0.05 μm as a unit.

Figure 12:
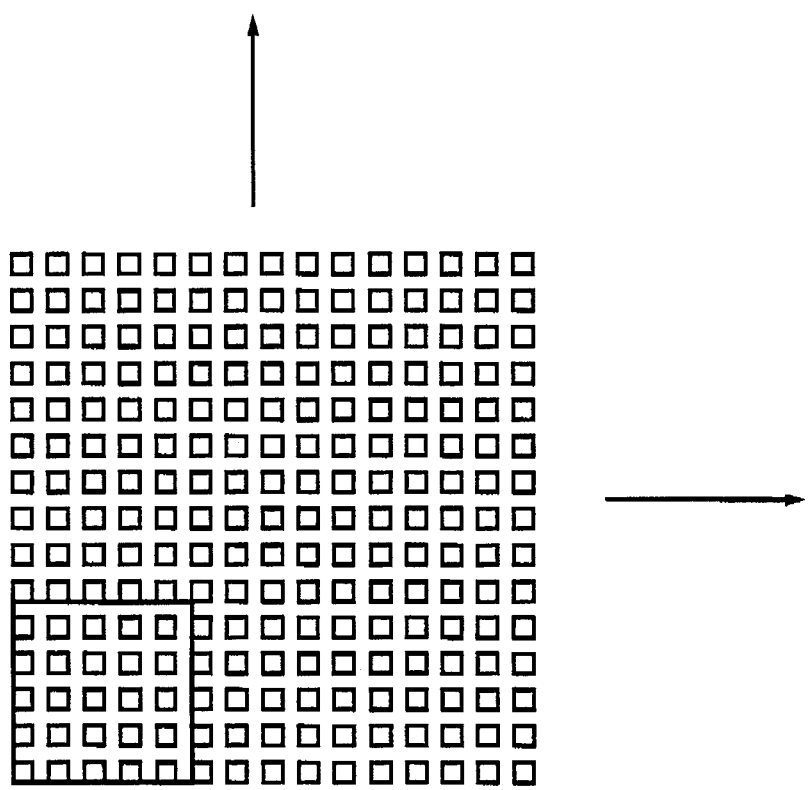
FIG. 12 is a diagram of a pattern that is written using the system of the first embodiment.

FIG. 12 illustrates an example of a pattern written by the blanking array. The figure written in an X,Y area indicated by the rectangle shown in the figure is an area written by one time of exposure. A plurality of figures can be written at one time provided the pattern is not so complex.

Figure 13:
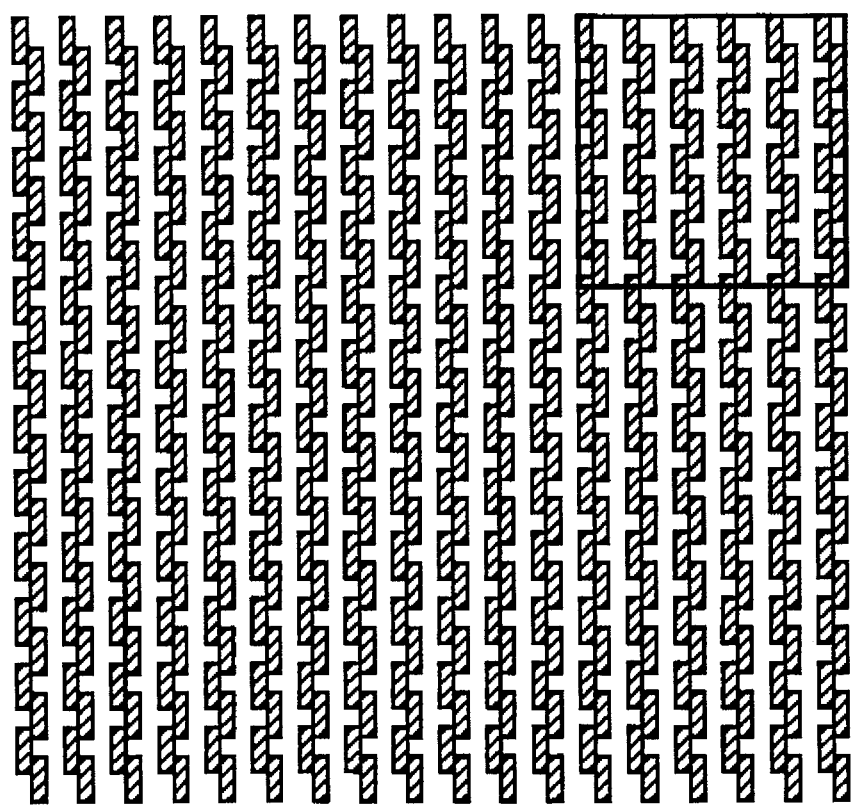
FIG. 13 is a diagram illustrating the structure of a memory pattern according to the first embodiment of the invention.

FIG. 13 illustrates an example of writing a memory cell pattern. Though a complex pattern cannot be written by one time of exposure, several figures can be simultaneously written if the figure is divided into two, i.e., a white portion and a black portion. Thus, the figures can be written in a relatively small number of times of exposure. By using the blanking array as described above, the number of shots can be greatly decreased. In a 256-megabit DRAM, the number of shots can be decreased from $6 \times 10^{10}$ to $3 \times 10^9$ as compared with a conventional variable shaped electron beam method. This makes it possible to accomplish a throughput of 10 6-inch wafers per unit of time.

Unlike the variable shaped method, furthermore, there is no need of adjusting the overlapping of the first aperture and the second aperture (in the variable shaped method, a square aperture like that of the peripheral frame of the blanking array is provided at a place where the blanking array is disposed), and the beam size does not change accompanying the change in the adjustment. Accordingly, the dimensional accuracy in writing the figure that has heretofore been hovering around 0.05 μm can be improved up to 0.02 μm.

There are 202 electric wires to be controlled according to a preferred embodiment of the invention. In order to control as many exposure areas with a conventional blanking array having apertures that divides the broad electron beam into individual beams, one for each exposure area, 10000 electrodes would be required. Therefore, the invention helps to greatly simplify the control operation.

According to this first embodiment of the invention, an ordinary square aperture for variable shaping is left remaining if the electrodes of the blanking array are removed. Therefore, the device can be used as an ordinary square aperture in a writing system for variable shaping if the blanking array is not operated, i.e. no voltage potential is applied to the electrodes. As shown in the figures, furthermore, a method can be carried out to define a final size by determining a rough size by the variable shaped method and by operating the blanking array to determine the fine size adjustments. By using this method, the figure can be written highly accurately by adding the blanking array of the present invention to the apparatus used in performing a conventional variable shaped method.

Figure 14:
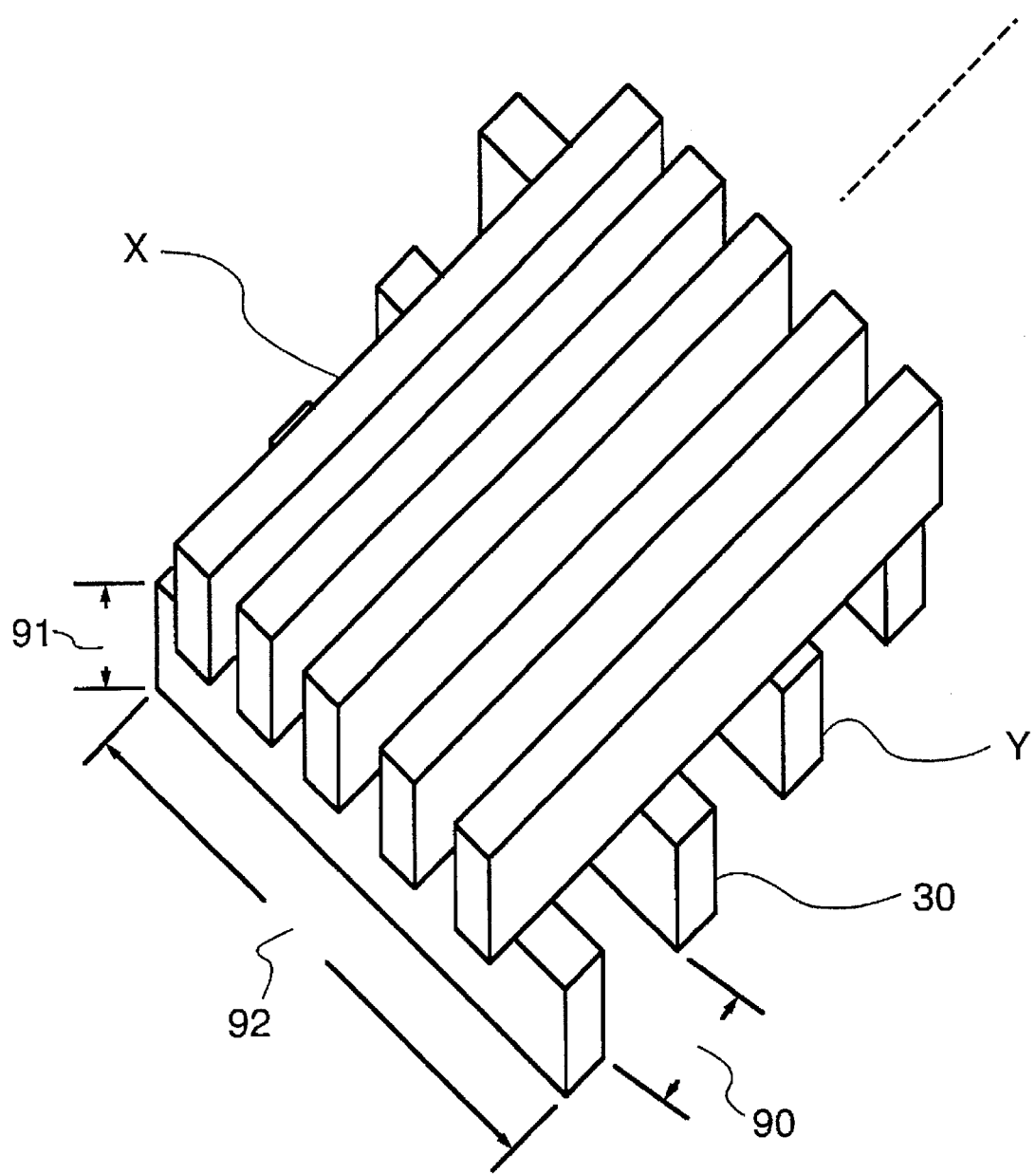
FIG. 14 is a diagram illustrating the structure of the blanking array according to a second embodiment of the invention.

FIG. 14 illustrates a blanking array according to a second embodiment of the invention, wherein the electric wires 30 are arranged in two directions in one array, with an insulator therebetween, so as to constitute a mesh of 50×50 electric wires. Electrodes are attached to the electric wires to apply electric field to the electrons. The spacing 90 between the electrodes, according to a preferred embodiment of the invention, is 1.7 μm, the height 91 thereof 4 μm, and the length 92 is equal to 250 μm. A voltage of 10 volts is applied with a voltage supply connected to the electrodes through individual switches for each of the electrodes to these electrodes to deflect the electrons.

Figure 15:
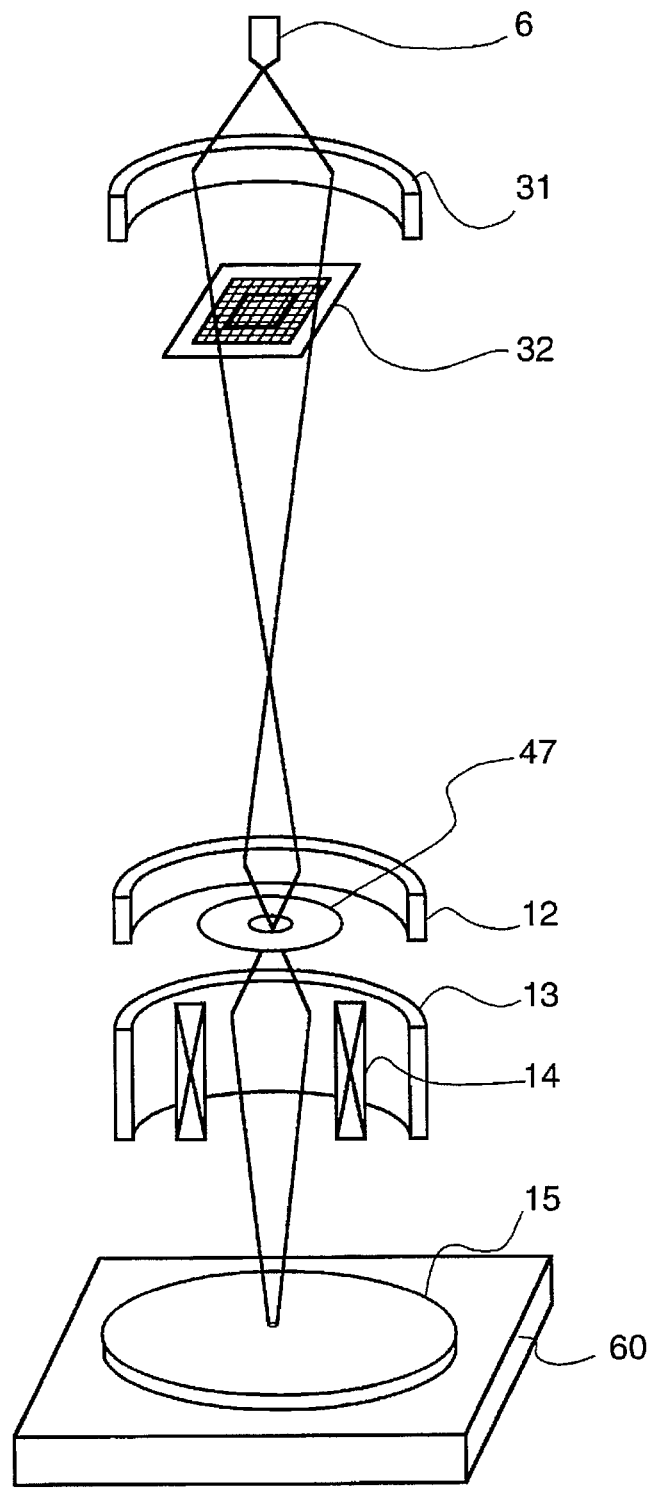
FIG. 15 is a diagram of the electro-optical system according to the second embodiment of the invention.

FIG. 15 illustrates an electro-optical system according to a second embodiment of the invention. An electron source 6 is installed at a position of the crossover image of a first projection lens 31 in a conventional system in which the variable shaping method is employed. Accordingly, the conventional optical system can be used for the stages downstream from the electron source. This makes it possible to omit a lens as compared with the apparatus of the first embodiment. The demagnification ratio is set to be 1/50, and a minimum writing unit is set to be 0.04 μm according to this embodiment. In the 256-megabit DRAM, therefore, the number of shots can be decreased from $6 \times 10^{10}$ to $1 \times 10^9$, making it possible to accomplish the throughput of 15 6-inch wafers per unit time.

Figure 16:
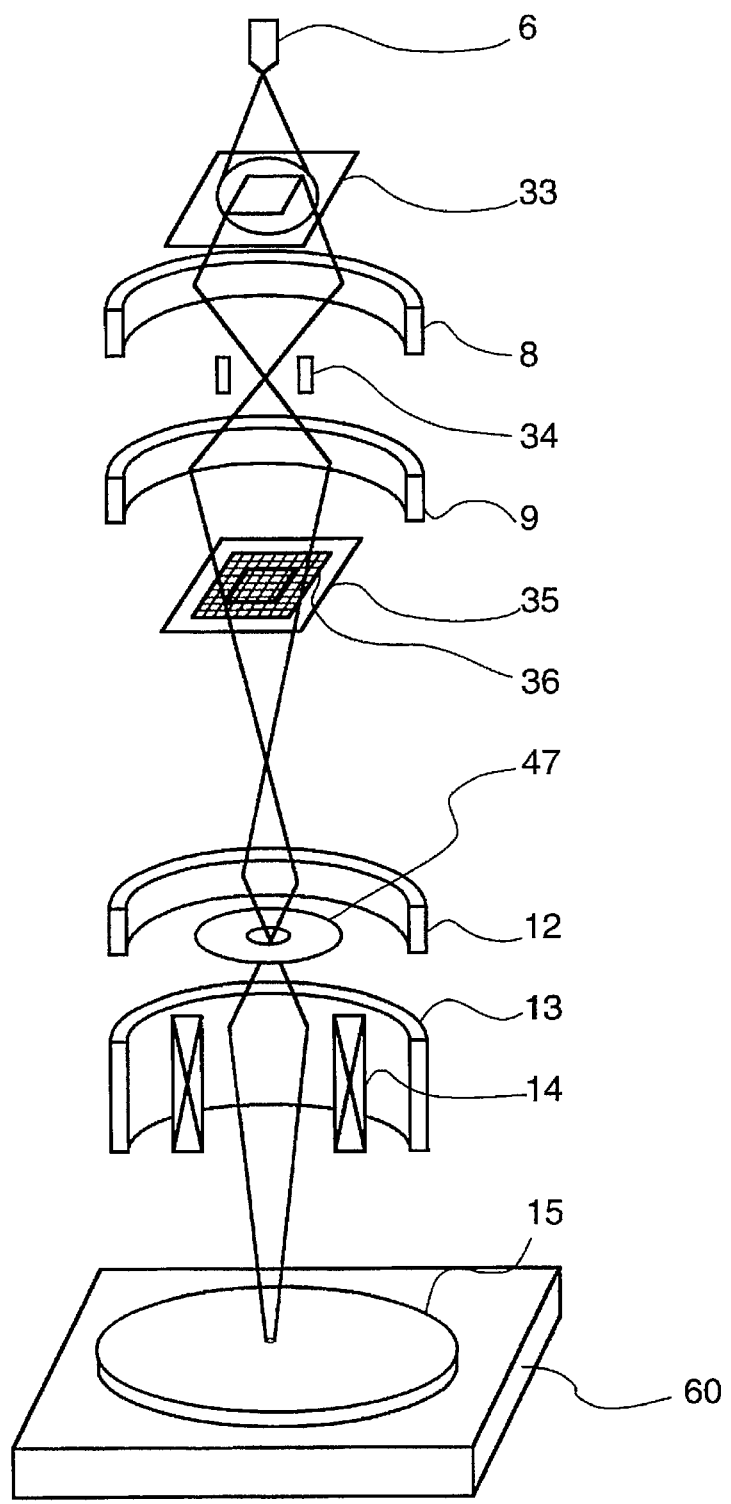
FIG. 16 is a diagram of the electro-optical system according to a third embodiment of the invention.

FIG. 16 illustrates an electro-optical system according to a third embodiment of the invention using a variable shaping method and the blanking array of the invention in combination. In FIG. 16, the blanking array 36 is formed on the square aperture 35 typically provided for variable shaping. Therefore, the ordinary variable shaping beam can be formed if the blanking array is placed in a completely inoperative state. By combining them together, furthermore, the following use can be accomplished.

Figure 17:
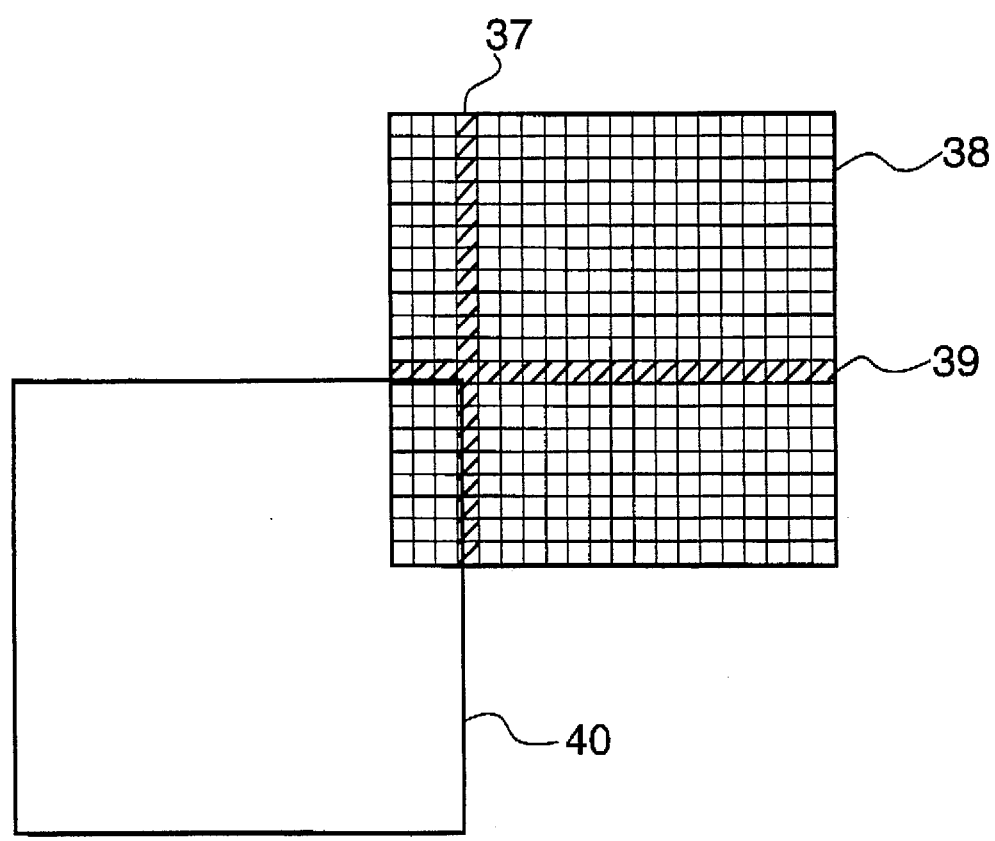
FIG. 17 is a diagram explaining a writing system using the third embodiment.

Referring also to FIG. 17, a rough sized image 40 is determined by the variable shaping aperture 33 and a final sized image is determined by blanking lines 37 and 38 using the blanking array in square aperture 35. In FIG. 17, there are written only 24 beam exposure areas defined by 8 (vertical) and 3 (lateral) squares at the lower left of the blanking array. The size of the electron beam is determined solely by the structure of the blanking array and, hence, writing is accomplished while maintaining favorable accuracy.. Accordingly, writing is accomplished maintaining good accuracy without operating the blanking array in the area that is not irradiated through the first aperture 35.

According to this embodiment which employs the blanking array for the square shaping, the dimensional accuracy is improved to 0.01 μm yet maintaining the same throughput.

Figure 18:
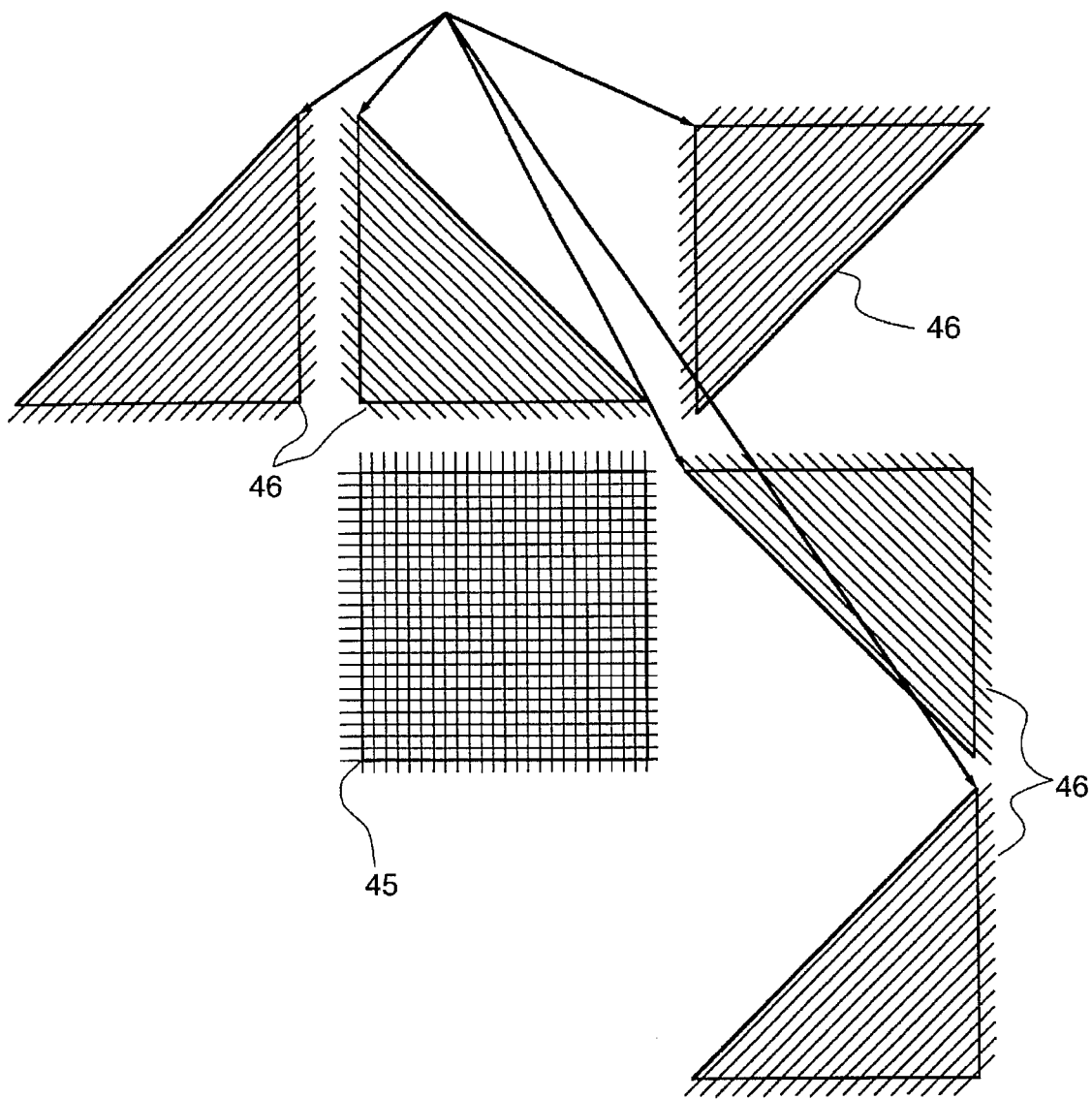
FIG. 18 is a diagram illustrating the structure of a blanking array according to a fourth embodiment of the invention.

FIG. 18 illustrates the structure of a blanking array according to a fourth embodiment of the invention, wherein a blanking array 45 is arranged at the center of a variable shaped beam, surrounded by blanking arrays 46 having angled electric wires in each array, preferably angled at 45° with respect to the wires (as shown in the figure) of array 45. By using the angled blanking arrays, a triangle can be written through one time of exposure. Triangles in various directions can be accomplished by optically selecting the blanking arrays, as shown.

Figure 19:
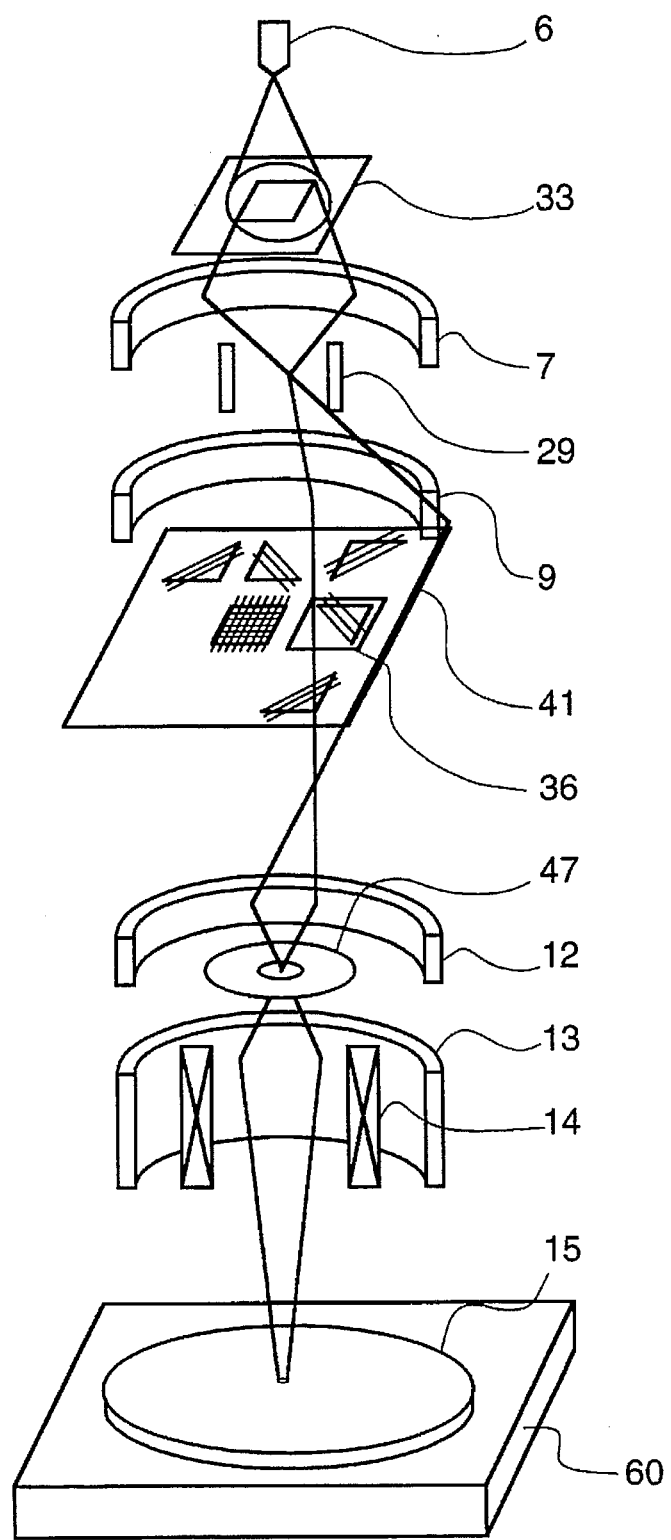
FIG. 19 is a diagram of the electro-optical system according to the fourth embodiment.

FIG. 19 illustrates an electro-optical system employing the blanking array according to the fourth embodiment of the invention wherein a square aperture 33 is focused on the blanking array 36 like in the first embodiment. In this embodiment, however, a blanking array selector/deflector 29 is provided. This makes it possible to select blanking arrays at high speed and to expose triangles and squares of various directions provided on plate 41 by using blanking arrays arranged generally as shown. It is possible, as an alternative, to mechanically select the blanking arrays on plate 41, however, this would be inferior to the electrical selection from the standpoint of high-speed operation.

The selection of various blanking arrays is not limited to arrays having angled lines but, instead, blanking arrays having dissimilar minimum writing units and dissimilar maximum writing areas may be arranged and selected depending upon the writing pattern.

If simple square apertures and figure-like apertures are arranged at the same time, the variable shaped method, cell projection method and blanking array writing method can be used on the same chip. This enables the variable shaping and the cell projection method to be easily controlled, and the flexibility of the banking array to be selected depending upon the shape of the writing patterns.

Figure 20:
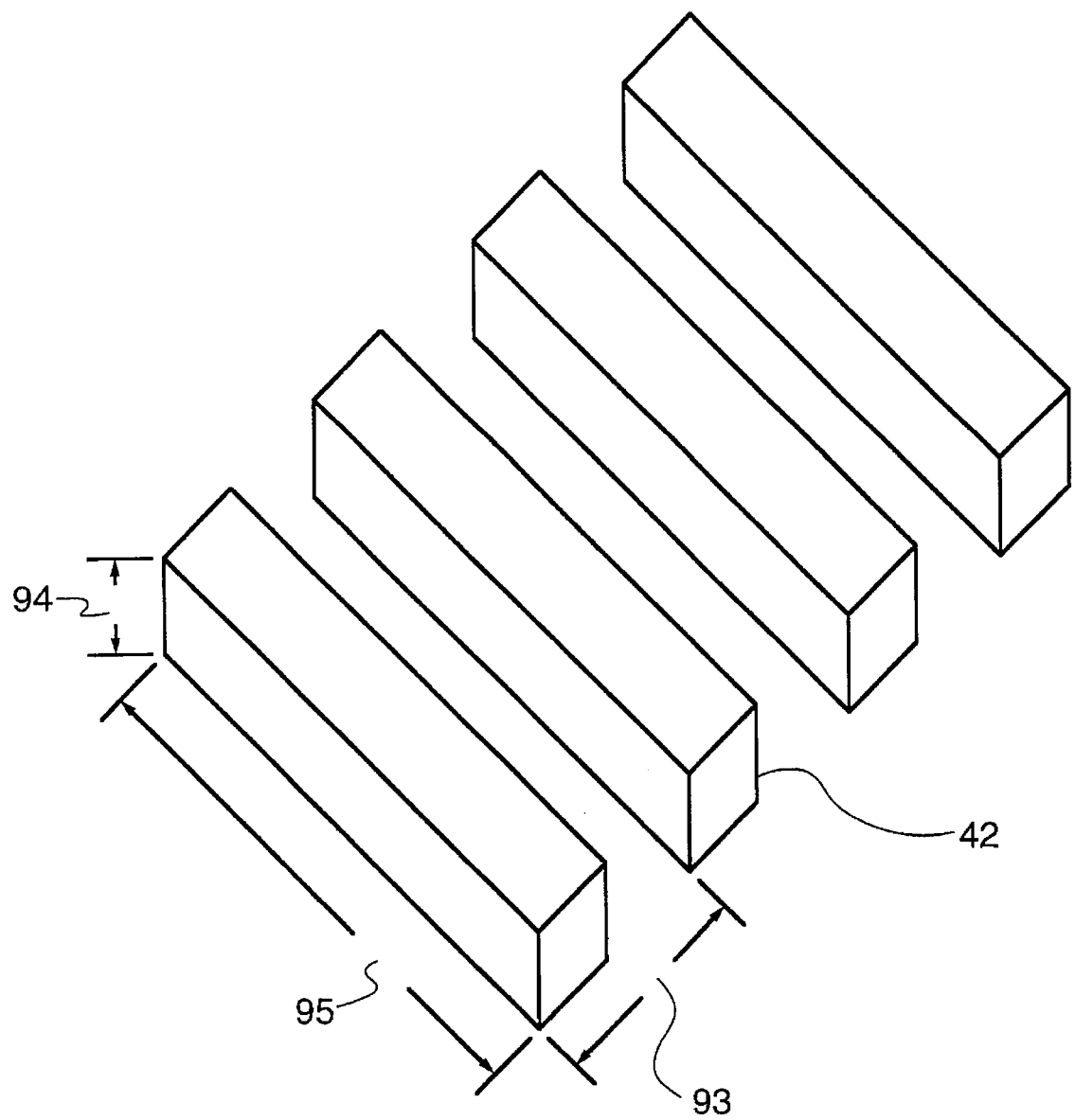
FIG. 20 is a diagram illustrating the structure of the blanking array according to a fifth embodiment of the invention.

FIG. 20 illustrates a blanking array constructed according to a fifth embodiment of the invention. The electric wires are arranged so as to constitute 21 lines according to the preferred embodiment. The electric wires 42 are arranged maintaining a pitch 93 of 4 μm with a height 94 of 4 μm and a length 95 of 400 μm. The electrodes 42 have a width of 2 μm, and an equivalent spacing. A voltage of 10 V is applied to these wires to deflect the electrons. Since the optical system has a demagnification ratio of 1/40, line and space patterns of 0.05 μm are formed in a state where the blanking is not operated. To write a square of, for example, 10 μm, therefore, the exposure is effected twice by shifting the blanking array by 0.05 μm. Since the electrodes have increased width, however, the blanking array possesses excellent mechanical strength and this makes it possible to realize a large-area shot, for example a square of 10 μm on the wafer. As a result, the number of shots for a 256 megabit DRAM is decreased to 1/20 compared with that of writing using a variable shaping method, and the throughput can be improved.

Figure 21:
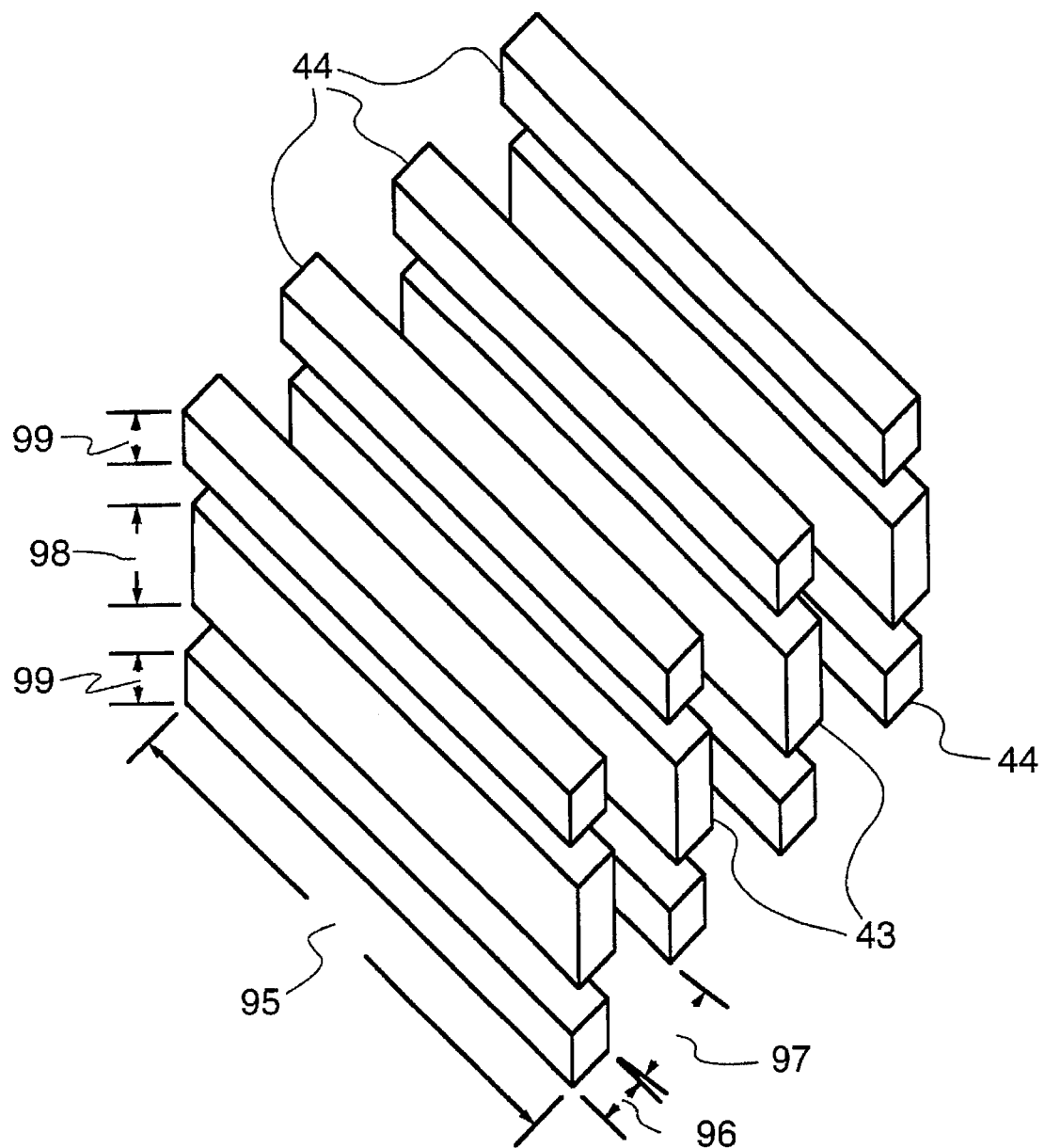
FIG. 21 is a diagram illustrating the structure of the blanking array according to a sixth embodiment of the invention.

FIG. 21 illustrates a blanking array according to a sixth embodiment of the invention. In the first and second embodiments, the electric wires are not protected from the electrons. Therefore, the electrons impinge upon the electric wires, and the blanking array loses its performance after it is used for extended periods of time due to contamination. In this embodiment, earth ground potential electrodes 44 are provided over and under the electrodes 43 of the blanking array, so that the electrons will not come into direct contact with the electric wires. According to this embodiment, both the electrode wires and the ground wires preferably have a width 96 of 0.3 μm and a spacing 97 of 1.7 μm. The height 98 of the electrodes 43 is preferably 4.0 μm and the height 99 of the ground wires 44 is preferably 2.0 μm. By this arrangement, the life of the blanking array can be extended significantly. This further makes it possible to prevent the blanking electric field from leaking into the upper and lower spaces.

Figure 22:
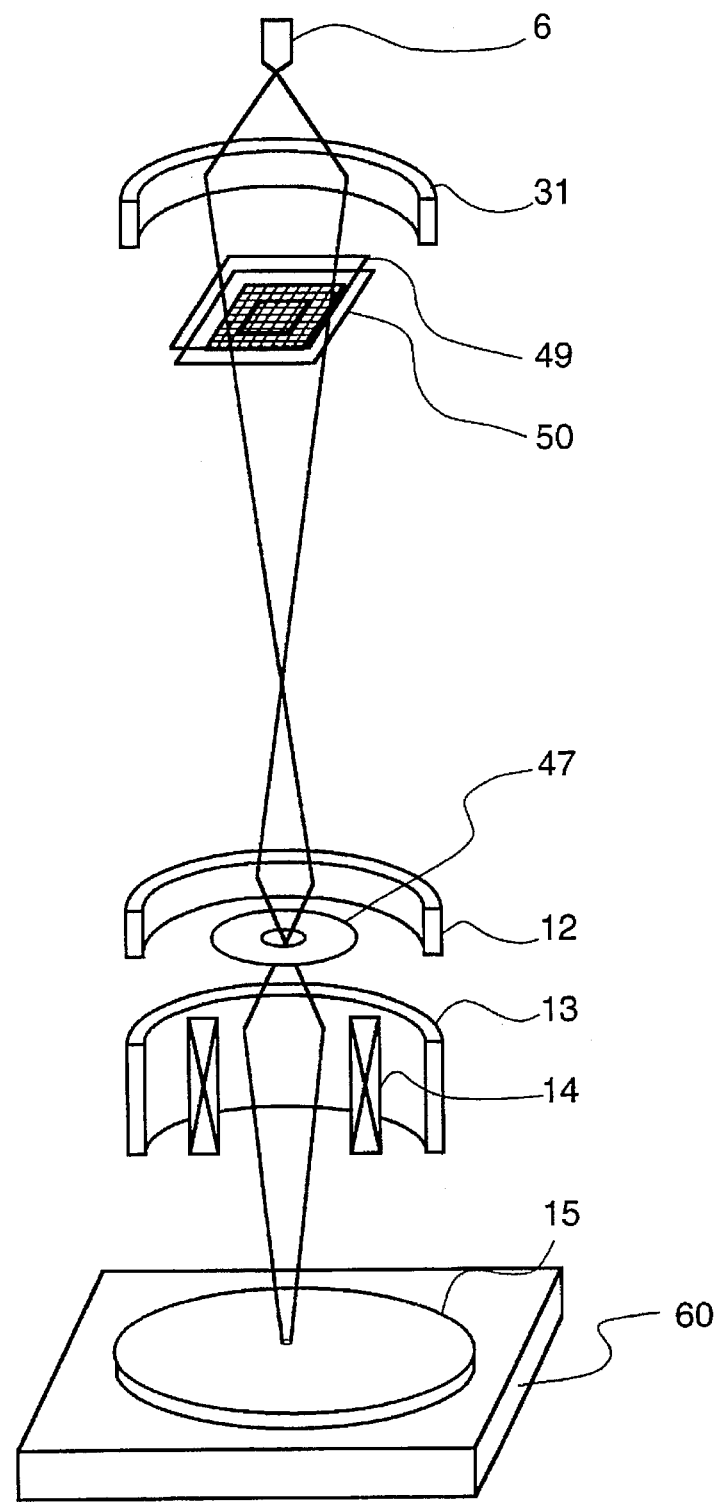
FIG. 22 is a diagram of an electro-optical system using blanking arrays according to a seventh embodiment of the invention.

FIG. 22 illustrates an electro-optical system according to a seventh embodiment of the invention. A square aperture is formed at an upper portion, and a square image is formed on the blanking array and on the cell projection aperture. Two blanking arrays 49 and 50 are arranged in the vertical direction maintaining a distance of 4 mm. Since the focal point is deep at the blanking arrays, the distance of 4 mm does not cause appreciable beam blurring on the wafer. This makes it possible to easily use a plurality of blanking arrays. Moreover, apertures of complex figures can be formed in the periphery for the cell projection method, not shown.

The present invention is in no way limited to the above-mentioned embodiments only, but encompasses the cases of using blanking arrays constituted by parallel electric wires extending across the election beam path in three or more directions. An increase in the number of directions the electric wires extend requires more complex control for array operation but makes it possible to write more complex figure (simultaneous exposure of square and angled lines) in one time of exposure. Though the above embodiments have dealt with the basic structure of the blanking array, the structure can be further constructed to reinforce its mechanical strength by supporting the aperture through which the electron beam passes using not only the electric wires but also using a mesh-like support.

We claim:

1. An electron beam writing apparatus having an electron source and a group of lenses for projecting a broad electron beam along an electron beam path onto a sample supported on a stage for direct write patterning of a sample with said electron beam, comprising:

at least one array of blanking elements set up above or under an aperture extending across said electron beam path wherein said blanking elements have linear elements;

a voltage driver connected to each of said blanking elements;

a controller connected to said voltage driver for controlling the voltages applied to ones of said blanking elements for forming shaped writing patterns on a sample supported on said stage by selectively deflecting electron beam portions that pass between said blanking elements; and said aperture blanking electron beam portions from being written on a sample supported on said stage.

2. An electron beam writing apparatus according to claim 1, including two of said arrays of blanking elements arranged in said electron beam path.

3. An electron beam writing apparatus according to claim 2, wherein each of said arrays of blanking elements includes a plurality of electrodes parallel to one another wherein the electrodes of a first one of said arrays of blanking elements extend in a first direction across said electron beam path and the electrodes of a second one of said arrays of blanking elements extends in a second direction transverse to said first direction.

4. An electron beam writing apparatus according to claim 2, further including said two arrays being positioned at a same position closely spaced apart within a same depth of focus.

5. An electron beam writing apparatus according to claim 1, wherein said at least one array of linear blanking elements has a first plurality of electrodes parallel to one another and a second plurality of electrodes parallel to one another wherein said first and second pluralities of electrodes extend transversely with respect to one another.

6. An electron beam writing apparatus according to claim 5, wherein said first and second plurality of electrodes are formed of a wire mesh.

7. An electron beam writing apparatus according to claim 1, wherein said at least one array is formed of a square aperture having conductors as said blanking elements that extend across said square aperture.

8. An electron beam writing apparatus according to claim 7, further including a variable shaping aperture arranged between said stage and said at least one array.

9. An electron beam writing apparatus according to claim 7, wherein said square aperture is made of an electron absorbing or an electron scattering substrate.

10. An electron beam writing apparatus according to claim 1, wherein said selectively deflected electron beam portions are square shaped areas.

11. An electron beam writing apparatus according to claim 1, wherein said at least one array is formed of a triangular aperture having two sides at right angles with respect to one another and a third side between said first and second sides, said array having conductors as said blanking elements that extend across said triangular aperture parallel to said third side.

12. An electron beam writing apparatus according to claim 1, further comprising said at least one array being a plurality of said arrays of blanking elements arranged on a plate positioned in said electron beam path and a selector deflector for deflecting said electron beam path to project said electron beam through a predetermined one of said plurality of arrays of blanking elements.

13. An electron beam writing apparatus according to claim 1, further including another of said arrays separate from said plurality of arrays that is arranged in said electron beam path between said electron beam source and said selector deflector.

14. An electron beam writing apparatus according to claim 1, wherein said at least one array is formed of an aperture having first conductors as said blanking elements that extend across said aperture and second conductors superposed on said first conductors connected to be at a ground potential voltage.

15. An electron beam writing apparatus according to claim 1, wherein said at least one array is formed of an aperture having conductors as said blanking elements that extend across said aperture, wherein said conductors have a width dimension and a spacing dimension between adjacent conductors, and wherein there is not larger than a 20% difference between said spacing dimension and said width dimension.

16. An electron beam writing apparatus having an electron source and a group of lenses for projecting a broad electron beam along an electron beam path onto a sample supported on a stage for direct write patterning with said electron beam, comprising:

at least first and second arrays of linear blanking elements extending across said electron beam path;

first and second voltage drivers connected to each of said blanking elements of said first and second arrays, respectively;

a controller connected to said first and second voltage drivers for controlling the voltages applied to adjacent ones of said blanking elements in each of said arrays for forming shaped writing patterns on a sample supported on said stage by selectively deflecting electron beam portions that pass between said adjacent ones of said blanking elements of each of said arrays; and an aperture between said stage and said arrays for blanking electron beam portions that are deflected by said blanking elements from being written on a sample supported on said stage.

17. An electron beam writing apparatus according to claim 16, wherein each of said arrays of linear blanking elements includes a plurality of electrodes parallel to one another wherein the electrodes of a first one of said arrays of linear blanking elements extend in a first direction across said electron beam path and the electrodes of a second one of said arrays of linear blanking elements extends in a second direction across said electron beam path orthogonal to said first direction so that square exposure areas are formed by predetermined ones of said electron beam portions not selectively deflected by said electrodes, said square exposure areas being combined to form said writing patterns.

18. An electron beam writing apparatus according to claim 17, wherein said electrodes are wires having a rectangular cross section and said arrays are formed of a square aperture that said wires extend across.

19. An electron beam writing apparatus according to claim 16, further including a demagnifying lens arranged between said arrays and said stage, wherein said electron beam portions not deflected by said electrodes are projected through said demagnifying lens so that said writing patterns are decreased in size when projected on a sample supported on said stage as compared with a size of the image of the writing patterns formed by said arrays.

20. An electron beam writing method for writing figures using an electron beam, comprising the steps of:

projecting a broad electron beam along an electron beam path onto a sample supported on a stage from an electron source;

deflecting said electron beam with at least one array of blanking elements set up above or under an aperture extending across said electron beam path said blanking elements having linear elements;

applying a voltage potential to each of said blanking elements;

controlling the voltage potential applied to ones of said blanking elements for forming shaped writing patterns on a sample supported on said stage by selectively deflecting electron beam portions that pass between said ones of said blanking elements; and blanking with said aperture electron beam portions from being written on a sample supported on said stage.

21. An electron beam writing method according to claim 20, including deflecting said electron beam with two of said arrays of blanking elements arranged in said electron beam path so that said blanking elements of said two arrays extend across said electron beam path.

22. An electron beam writing method according to claim 20, wherein said deflecting divides said electron beam into a matrix of electron beam areas formed by providing a plurality of electrodes parallel to one another in each of said arrays, wherein the electrodes of a first one of said arrays of blanking elements extend in a first direction across said electron beam path and the electrodes of a second one of said arrays of linear blanking elements extends in a second direction crossing said first direction so that said exposure areas are formed by predetermined ones of said electron beam portions not selectively deflected by said electrodes and said exposure areas are combined to form said writing patterns.

23. An electron beam writing method according to claim 20, wherein said forming of said writing patterns includes exposing a sample supported on said stage a plurality of times.

24. An electron beam writing method according to claim 22, wherein said deflecting divides said electron beam into a matrix of square shaped electron beam areas.

25. An electron beam writing method according to claim 20, further including providing a plurality of said arrays of blanking elements arranged on a plate positioned in said electron beam path and selecting a predetermined one of said plurality of arrays of blanking elements with a deflector by deflecting said electron beam path to project said electron beam through said predetermined array.

26. An electron beam writing method according to claim 25, further including providing another of said arrays separate from said plurality of arrays that is arranged in said electron beam path between said electron beam source and said deflector.

27. An electron beam writing method according to claim 20, further including forming said at least one array with a square aperture having electrodes as said blanking elements that extend across said square aperture and performing a variable shaped electron beam exposure method using said square aperture while controlling the voltage potential applied to said electrodes in said controlling step so that the electron beam is not deflected.

28. An electron beam writing method according to claim 27, wherein when said conductors have a width dimension and a spacing dimension between adjacent conductors, and wherein there is not larger than a 20% difference between said spacing dimension and said width dimension, said at least one array is shifted in a direction perpendicular to a longitudinal direction after a first exposure for writing said patterns by a distance substantially equivalent to said spacing dimension for a subsequent exposure.

29. An electron beam writing method according to claim 20, further including forming said at least one array with of a triangular aperture having two sides at right angles with respect to one another and a third side between said first and second sides, and arranging conductors as said blanking elements extending across said triangular aperture parallel to said third side.

30. An electron beam writing method according to claim 20, further including providing a demagnifying lens arranged between said arrays and said stage, wherein said electron beam portions not deflected by said electrodes are projected through said demagnifying lens so that said writing patterns are decreased in size when projected on a sample supported on said stage as compared with a size of the image of the writing patterns formed by said arrays.

* * * * *